United States Patent
Ng et al.

(10) Patent No.: US 7,252,859 B2
(45) Date of Patent: Aug. 7, 2007

(54) ORGANIC MATERIALS FOR AN EVAPORATION SOURCE

(75) Inventors: Kam C. Ng, Rochester, NY (US); Syamal K. Ghosh, Rochester, NY (US); Steven C. Switalski, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 375 days.

(21) Appl. No.: 10/994,070

(22) Filed: Nov. 19, 2004

(65) Prior Publication Data
US 2006/0110526 A1 May 25, 2006

(51) Int. Cl.
C23C 16/00 (2006.01)
(52) U.S. Cl. .............................. 427/248.1; 427/255.6; 427/255.23
(58) Field of Classification Search .............. None
See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 4,720,432 A | 1/1988 | VanSlyke et al. | |
| 4,769,292 A | 9/1988 | Tang et al. | |
| 4,885,211 A | 12/1989 | Tang et al. | |
| 6,237,529 B1 | 5/2001 | Spahn | |
| 6,337,102 B1 | 1/2002 | Forrest et al. | |
| 6,649,436 B2 | 11/2003 | Ghosh et al. | |
| 2003/0008071 A1* | 1/2003 | Van Slyke et al. | 427/255.28 |
| 2003/0015140 A1* | 1/2003 | Van Slyke et al. | 118/723 VE |
| 2004/0142098 A1 | 7/2004 | Ghosh et al. | |

FOREIGN PATENT DOCUMENTS

| | | |
|---|---|---|
| EP | 1 156 536 | 11/2001 |
| EP | 1 274 136 | 1/2003 |
| EP | 1 337 132 | 8/2003 |
| EP | 1 454 736 | 9/2004 |
| WO | WO 2004/070787 | 8/2004 |

OTHER PUBLICATIONS

Tikhonov et al, Equations of Mathematical Physics, MacMillan Company, 1963, pp. 282-289.
Goodman, The Heat-Balance Integral and Its Application to Problems Involving a Change of Phase, ASME Trans. vol. 80, No. 2 (1958) pp. 335-342.

* cited by examiner

Primary Examiner—Timothy Meeks
Assistant Examiner—Kelly M Stouffer
(74) Attorney, Agent, or Firm—Raymond L. Owens (57) ABSTRACT

A method of using a compacted pellet having uniform blended mixture with at least first and second different organic components that sublime at temperatures $T_1$ and $T_2$ respectively, wherein $T_1$ represents the temperature of the first organic material with the lowest sublimation temperature and $T_2$ represents the temperature of the second organic material with the highest sublimation temperature, to form an organic layer having a uniform blended mixture of the organic components, includes providing a compacted pellet, having a top and bottom surface, into a boat having an open top surface wherein the compacted pellet conforms to the interior of the boat; and applying heat to the top of the compacted pellet to cause the deposition of a uniform blended mixture of the organic components to form an organic layer.

5 Claims, 8 Drawing Sheets

*FIG. 1*

( PRIOR ART )

ORGANIC MATERIALS FOR AN EVAPORATION SOURCE

CROSS REFERNCE TO RELATED APPLICATIONS

Reference is made to commonly assigned U.S. patent application Ser. No. 10/384,290 filed Mar. 7, 2003 entitled "Making and Using Compacted Pellet for OLED Displays" by Ghosh et al., and U.S. patent application Ser. No. 10/624,311 filed Jul. 22, 2003 entitled "Thermal Physical Vapor Depositions Source Using Pellets of Organic Material for Making OLED Displays" by Klug et al, the disclosures of which are incorporated herein by reference.

FIELD OF THE INVENTION

The present invention relates to using a compacted pellet of organic materials including a host and at least one dopant mixed therein to form an organic layer. More particularly, this invention relates to using a compacted pellet of mixed organic materials wherein such compacted pellet is used in a single evaporation source in a physical vapor deposition process.

BACKGROUND OF THE INVENTION

An organic light-emitting diode (OLED), also referred to as an organic electroluminescent device, can be constructed by sandwiching two or more organic layers between first and second electrodes. An OLED device includes a substrate, an anode, an organic hole-transporting layer, and an organic luminescent (emission) layer with suitable organic dopants, an organic electron-transporting layer, and a cathode. OLED devices are attractive because of their low driving voltage, high luminance, wide-angle viewing and capability for full-color flat emission displays. This multilayer OLED device is discussed in commonly-assigned U.S. Pat. Nos. 4,769,292 and 4,885,211.

Organic materials, thickness of vapor-deposited organic layers, and layer configurations, useful in constructing an OLED device, are described, for example, in commonly-assigned U.S. Pat. Nos. 4,356,429; 4,539,507; 4,720,432; and 4,769,292, the disclosures of which are herein incorporated by reference.

Organic materials useful in making OLED devices, for example organic hole-transporting materials, organic light-emitting materials predoped with an organic dopant, and organic electron-transporting materials can have relatively complex molecular structures with relatively weak molecular bonding forces, so that care must be taken to avoid decomposition of the organic material(s) during physical vapor deposition.

The aforementioned organic materials are synthesized to a relatively high degree of purity, and are provided in the form of powders, flakes, or granules. Such powders, flakes or granules have been used heretofore for placement into a physical vapor deposition source wherein heat is applied for forming a vapor by sublimation or vaporization of the organic material, the vapor condensing on a substrate spaced apart from the deposition source to provide an organic layer thereon.

Several problems have been observed in using organic powders, flakes, or granules in physical vapor deposition:
(i) powders, flakes, or granules are difficult to handle because they can acquire electrostatic charges via a process referred to as triboelectric charging;
(ii) powders, flakes, or granules of organic materials generally have a relatively low physical density (expressed in terms of weight per unit volume) in a range from about 0.05 to about 0.2 $g/cm^3$, compared to a physical density of an idealized solid organic material of about 1 $g/cm^3$;
(iii) powders, flakes, or granules of organic materials have an undesirably low thermal conductivity, particularly when placed in a physical vapor deposition source which is disposed in a chamber evacuated to a reduced pressure as low as $10^{-6}$ Torr. Consequently, powder particles, flakes, or granules are heated only by radiative heating from a heated source, and by conductive heating of particles or flakes directly in contact with heated surfaces of the source. Powder particles, flakes, or granules which are not in contact with heated surfaces of the source are not effectively heated by conductive heating due to a relatively low particle-to-particle contact area; and
(iv) powders, flakes, or granules can have a relatively high ratio of surface area/volume of such particles and a correspondingly high propensity to entrap air and/or moisture between particles under ambient conditions. Consequently, a charge of organic powders, flakes, or granules loaded into a physical vapor deposition source which is disposed in a chamber must be thoroughly outgased by preheating the source once the chamber has been evacuated to a reduced pressure. If outgasing is omitted or is incomplete, particles can be ejected from the source together with a vapor stream during physical vapor-deposition of an organic layer on a structure.

Other types of imaging devices, such as imaging phosphors for computed radiography and x-ray photoconductive devices for digital radiography, depend on the ability to coat the active materials uniformly over large areas. While the following discussion pertains to OLED displays, it should be readily apparent that the same invention can be applied to the deposition of alkalihalide phosphors, amorphous semiconductors, and other luminescent or photoactive layers, as well as a variety of other materials used in devices based on such luminescence or photoactive layers.

For sufficiently small substrates, a point source approach can be implemented wherein the material to be deposited emanates from a localized heated crucible and the substrate is placed far enough from the localized region of vaporization so that the coating is sufficiently uniform along the substrate. As substrate size increases or working distance increases, rotary or planetary motion of the substrate relative to the localized source is often required to produce the desired uniformity.

By elongating the vaporization source and providing for translation of source and substrate relative to one another, the desired uniformity can be attained at considerably smaller working distances and thus considerably higher rates and better materials utilization, if desired. Scaling of such a process to large areas (i.e. substrates greater than 15 cm in at least one dimension) is considerably easier than for point sources.

An elongated source (also known as a linear source) for thermal physical vapor deposition of organic layers onto a structure for making an organic light-emitting device has been disclosed by Spahn in commonly assigned U.S. Pat. No. 6,237,529. The source disclosed by Spahn includes a housing, which defines an enclosure for receiving solid organic material, generally in powder form, which can be vaporized. The housing is further defined by a top plate which defines a vapor efflux slit-aperture for permitting organic vapors to pass through the slit onto a surface of a structure spaced apart from the elongated source. The housing defining the enclosure is connected to the top plate. The source disclosed by Spahn further includes a conductive baffle member attached to the top plate. This baffle member provides line-of-sight covering of the slit in the top plate so that organic vapors can pass around the baffle member and through the slit onto the substrate or structure while particles of organic materials are prevented from passing through the slit by the baffle member when an electrical potential is applied to the housing to cause heat to be applied to the solid organic material in the enclosure causing the solid organic material to vaporize.

In using the thermal physical vapor deposition source disclosed by Spahn to form an organic layer of a selected organic material on a substrate or structure, it has been found that the vapor efflux slit-aperture causes non-uniform vapor flux of organic material to emanate along a length dimension of the slit. There is a problem when the width dimension of the slit is reduced, for example, to a width dimension less than 0.5 mm. Such spatially non-uniform orientation of opposing slit edges can be thought of as a deviation of planarity of opposing edges which, in turn, can promote a greater fraction of organic vapors to exit the vapor deposition source through a central portion of the slit, with a correspondingly lower fraction of organic vapors exiting the source through remaining portions of the slit along its length dimension. Such non-uniform vapor flux, directed at a substrate or structure, will cause the formation of an organic layer thereon which will have a non-uniform layer thickness in correspondence with the non-uniform vapor flux.

In addition, any nonuniformities in heat generation from the heater or heat absorption by the material to be deposited or distribution of the material within the source can give rise to nonuniformity in deposition along the length of the source. Yet another source of nonuniformity is unintended leaks in the source enclosure other than the apertures used to deliver the organic vapor. If such leak exists at the ends of the source., the flow of vapor from center to end of the source can cause pressure gradients within the source, thereby causing nonuniformity in the resultant deposition.

Forrest et al. (U.S. Pat. No. 6,337,102B1) disclosed a method of vaporizing organic materials and organic precursors and delivering them to a reactor vessel wherein the substrate is situated and delivery of the vapors generated from solids or liquids is accomplished by use of carrier gases. In one embodiment of their invention, Forrest et al. located the substrates within a suitably large reactor vessel, and the vapors carried thereto mix and react or condense on the substrate. Another embodiment of their invention is directed towards applications involving coating of large area substrates and putting several such deposition processes in serial fashion with one another. For this embodiment, Forrest et al. disclosed the use of a gas curtain fed by a gas manifold (defined as "hollow tubes having a line of holes") in order to form a continuous line of depositing material perpendicular to the direction of substrate travel.

The approach to vapor delivery as disclosed by Forrest et al. can be characterized as "remote vaporization" wherein a material is converted to vapor in an thermal physical deposition source external to the deposition zone and more likely external to the deposition chamber. Organic vapors alone or in combination with carrier gases are conveyed into the deposition chamber and ultimately to the substrate surface. Great care must be taken using this approach to avoid unwanted condensation in the delivery lines by use of appropriate heating methods. This problem becomes even more critical when contemplating the use of inorganic materials that vaporize to the desired extent at substantially higher temperatures. Furthermore, the delivery of the organic vapor for coating large areas uniformly requires the use of gas manifolds.

A method of making compacted pellets using a mixture of organic materials comprising at least one host and one dopant to form an organic layer on a substrate which will form an OLED display is disclosed by Ghosh et al. in commonly assigned U.S. Pat. No. 6,649,436. The method disclosed by Ghosh et al. utilizes a point or a linear evaporation source wherein the mixture of organic materials is vaporized by heating from the top of the source. The advantages achieved by this method is that separate evaporation sources for the purpose of co-evaporation are not required for making an organic layer in making an OLED display. This method of deposition is strongly dependent on the vapor pressure and sublimation temperature of each individual organic component in the mixture. It is possible that compacted pellets using a mixture of two organic materials wherein one organic component has substantially a lower sublimation temperature as compared to the other organic component, will be prone to depletion of that organic component having lower sublimation temperature in a relatively short time. Markedly different sublimation temperatures of the organic components may render the compacted pellets unusable in a manufacturing environment because the evaporation sources are used continuously for hours in making OLED displays.

Each one, or a combination, of the aforementioned aspects of organic powders, flakes, or granules can lead to nonuniform heating of such organic materials in physical vapor deposition sources with attendant spatially nonuniform sublimation or vaporization of organic material and can, therefore, result in potentially nonuniform vapor-deposited organic layers formed on a structure.

SUMMARY OF THE INVENTION

The present invention provides a method of using a compacted pellet having uniform blended mixture with at least first and second different organic components that sublime at temperatures $T_1$ and $T_2$ respectively, wherein $T_1$ represents the temperature of the first organic material with the lowest sublimation temperature and $T_2$ represents the temperature of the second organic material with the highest sublimation temperature, to form an organic layer having a uniform blended mixture of the organic components, comprising:

(a) providing a compacted pellet, having a top and bottom surface, into a boat having an open top surface wherein the compacted pellet conforms to the interior of the boat; and (b) applying heat to the top of the compacted pellet to cause the deposition of a uniform blended mixture of the organic components to form an organic layer.

A feature of the present invention is that the effectiveness of pellets of organic material including a mixture of a host and at least one dopant can be determined prior to making such pellet.

Another feature of the present invention is that compacted pellets made in accordance therewith can be used in a single evaporation source to effectively make organic layers. The effectiveness of such a mixture is that a homogeneous deposition of materials can be deposited, ensuring that the formed organic layer provides its intended function.

The term "powder" is used herein to denote a quantity of individual particles, which can be flakes, granules, or mixtures of varied particles and shapes including single or plurality of molecular species.

DETAILED DESCRIPTION OF THE INVENTION

Figure 1:
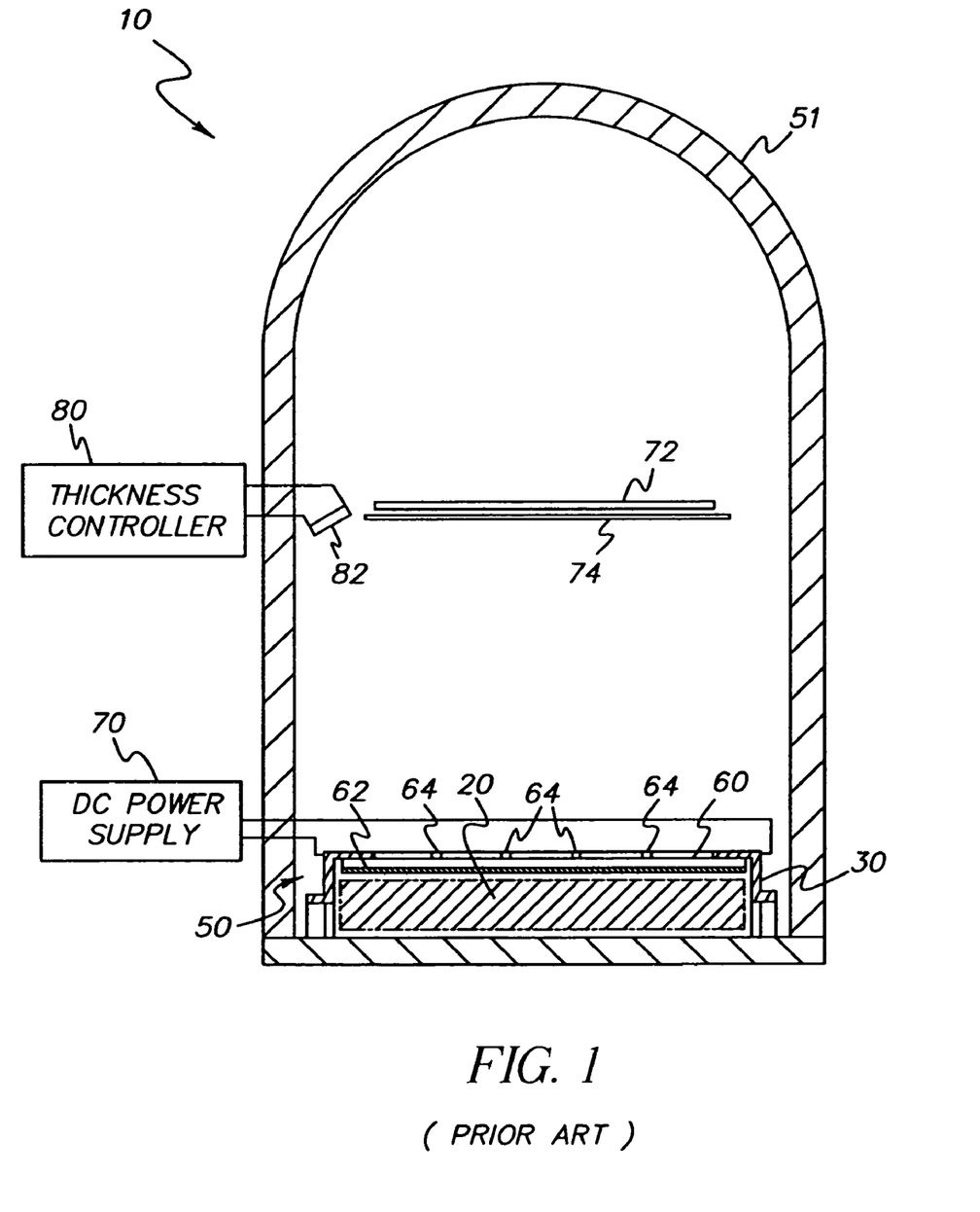
FIG. 1 depicts a cross-sectional view of a linear source for deposition of organic layers for OLED displays of the prior art.

The organic layers of an OLED include an organic or organo-metallic material that produces light, known as electroluminescence (EL), as a result of electron-hole recombination in the layer. Hereinafter, the term "organic" will be taken to include both purely organic as well as organo-metallic materials. Turning to FIG. 1, a schematic of a physical vapor deposition chamber 10 of the prior art is shown wherein a uniform blended mixture of organic materials as a compacted pellet 20 is heated from the top surface to deposit organic layers for an OLED display. For the sake of simplicity, a single evaporation source 50 including the compacted pellet (source) 20, a receptacle 30, a heater 60 and a baffle 62, is connected to a DC power supply 70 for providing electrical energy in order to evaporate or sublime the compacted pellet 20 of organic materials. The heater 60 is provided with a series of openings 64 in the form of a hole or slit to permit organic vapors to escape from the single evaporation source 50 for deposition on a suitable receiving substrate 72, which is anchored to a fixture spaced apart from the single evaporation source 50 inside a bell jar 51. The substrate 72 is equipped with a rotatable shutter 74 to protect it from deposition of any unwanted vapor onto the substrate 72. A thickness controller 80 located outside the bell jar 51 controls the rate of vapor deposition on the substrate 72. A crystal 82 is placed in close proximity to the substrate 72 to measure accurately the rate of vapor deposition onto the substrate 72 wherein the crystal 82 is electrically connected to the thickness controller 80 which monitors the rate of vapor deposition from the compacted pellet 20 of organic materials. Preferably, the pellets can be compacted. However, they can be formed without compaction. For example, material components can be placed inside a boat and molded to conform to the interior of such boat.

Figure 2:
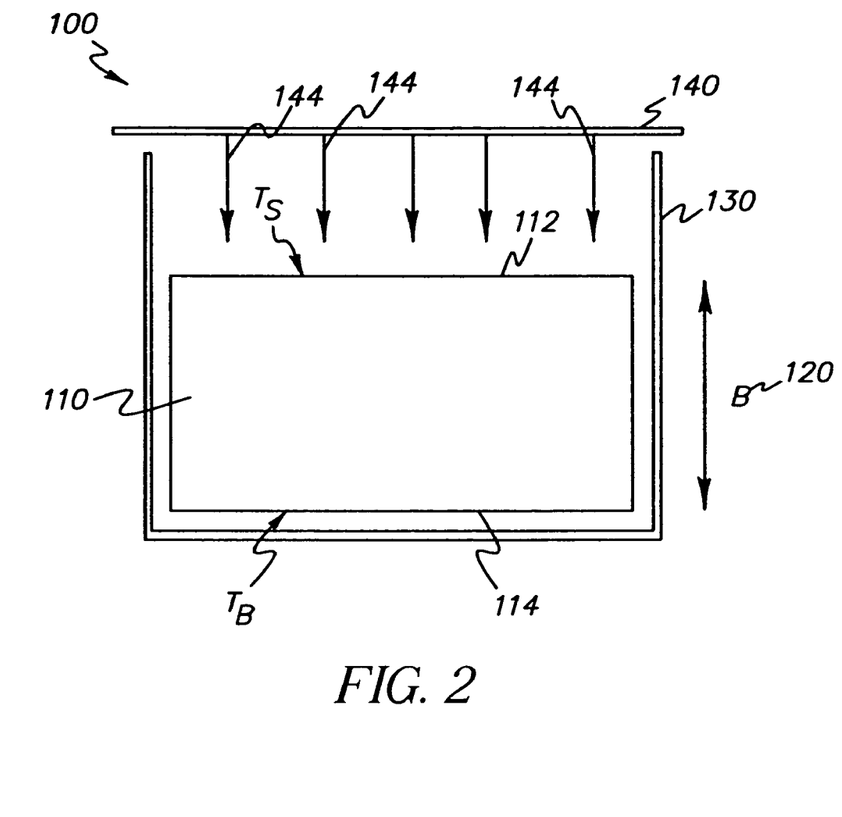
FIG. 2 depicts a compacted pellet exposed to a heat source.

FIG. 2 shows a simplified partial cross-sectional view of a single evaporation source 100 wherein a compacted pellet 110 of uniformly mixed organic materials has at least one host component and at least one dopant component has been placed inside and conforms to the interior of a quartz boat 130 wherein the top surface 112 of the compacted pellet 110 is exposed to heat flux 144 shown by arrow radiating from a heating element 140. The use of the term "conforms" means that the pellets, whether compacted or not, touches all boat sides as well as the bottom of the boat 130. A gap between the pellet and the boat sides can cause the vapor to escape changing the composition of the pellet. A feature of the present invention is the ability to predict deposition conditions for a single evaporation source so that the uniformly blended organic host and dopant components are deposited onto a substrate in desired proportion to form an OLED display.

In accordance with the present invention, deposition conditions for a two-component single evaporation source are formulated wherein h is the concentration of organic host component having a sublimation temperature $T_2$ and d is the concentration of organic dopant component having a sublimation temperature $T_1$, and the materials are selected such that the sublimation temperature $T_2$ is greater than the sublimation temperature $T_1$. It is worth mentioning that a single evaporation source comprising more than two organic components can be formulated in a similar fashion applying the same method as that formulated for a two-component single evaporation source. When an organic component reaches its sublimation temperature, it evaporates. For those organic molecules located far below the top surface 112 of the compacted pellet 110, it would take longer time to escape from the top surface 112 depending on the diffusivity of the organic vapor species through the compacted organic pellet.

When energy is applied to the heating element 140, the top surface 112 of the compacted pellet is irradiated with heat flux as shown by the arrows 144 and that will reach a temperature $T_s$ almost instantaneously and the temperature $T_s$ will rise with respect to time as the heat is continuously applied. If $t_1$ is the time required for the surface temperature $T_s$ to rise to the sublimation temperature $T_1$ of the dopant component d, it will start to sublime (evaporate). If $t_2$ is the time required for the surface temperature $T_s$ to rise to the sublimation temperature $T_2$ of the host component h, it will begin to sublime. Since $T_2$ is selected to be greater than $T_1$ the time $t_2$ the host component h takes to reach the sublimation temperature $T_2$ is greater than the time $t_1$ the dopant component d takes to reach the sublimation temperature $T_1$ for the respective molecules to sublime.

Figure 3:
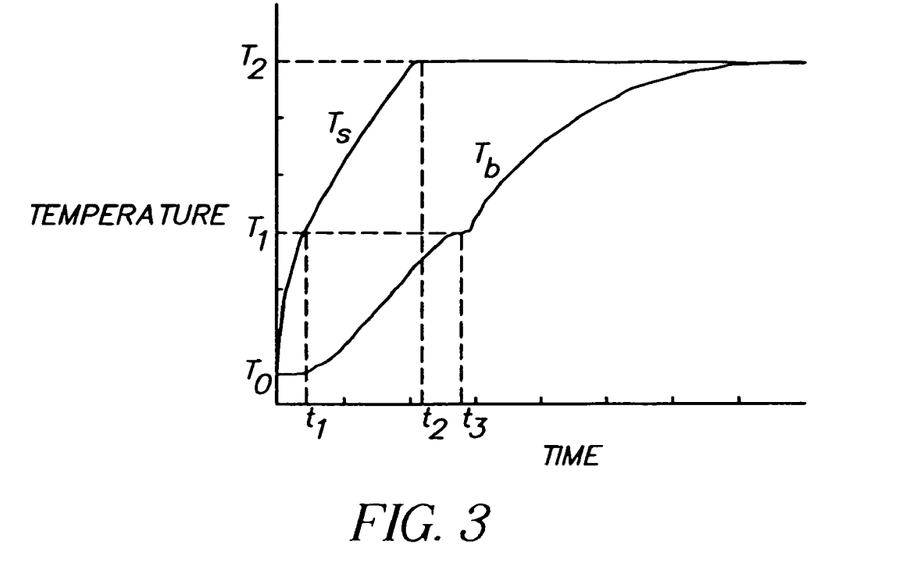
FIG. 3 shows a temperature profile of the compacted pellet with respect to time of deposition of organic layers.

FIG. 3 shows graphically the single source deposition conditions for a two-component compacted pellet from a single evaporation source, wherein the temperatures of the top and bottom surfaces of a compacted pellet, $T_s$ and $T_b$ respectively, at any given time, are plotted against time. In this case, $t_3$, the time required for the temperature at the bottom surface 114 of the compacted pellet 110 (see FIG. 2) to reach the sublimation temperature $T_1$ of the dopant component d, is larger than $t_2$, the time required for the temperature at the surface to reach the sublimation temperature $T_2$ of the host component h. Referring to FIG. 2 again, B is the vertical dimension (height) 120 of the compacted pellet 110. This also suggests that a larger difference in temperature between the top surface $T_s$ and the bottom surface $T_b$ as shown in FIG. 3 yields a better deposition condition from the single evaporation source. Both organic components start subliming simultaneously at any time greater than $t_2$ enabling depositing a thin layer of organic materials in uniform composition.

Figure 4:
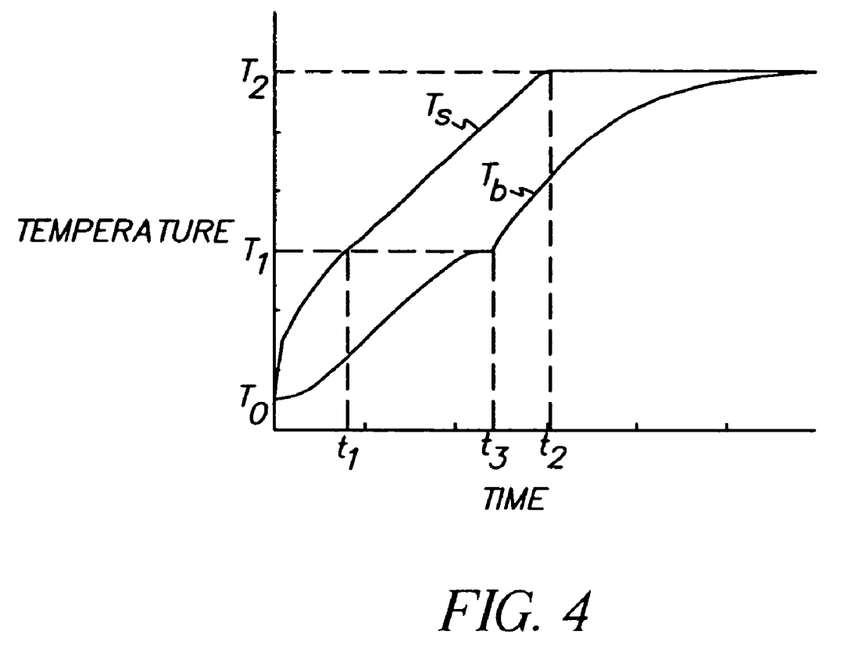
FIG. 4 shows another temperature profile of the compacted pellet with respect to the time of deposition of organic layers.

FIG. 4 shows graphically another deposition condition for a two-component compacted pellet from a single evaporation source, wherein the temperatures of the top and bottom surfaces of a compacted pellet, $T_s$ and $T_b$ respectively, at any given time, are plotted against time. In this case, $t_2$, the time required for the temperature at the surface to reach the sublimation temperature $T_2$ of the host component h, is larger than $t_3$, the time required for the temperature at the bottom surface 114 of a compacted pellet 110 (see FIG. 2) to reach the sublimation temperature $T_1$ of the dopant component d. The time required for the sublimed (vaporized) dopant component d close to the bottom surface 114 of the compacted pellet 110 to escape through the top surface 112 of the compacted pellet is represented by a relationship $B^2/D$, where D is the diffusion coefficient of the sublimed molecules of the dopant component d. If $t_2$ is the time required for the surface of the compacted pellet to reach the sublimation temperature $T_2$ of the host component h, and if $t_2$ is less than the time for the sublimed dopant component d close to the bottom surface 114 to escape through the top surface, $t_3+B^2/D$, then both the host component h and the dopant component d will sublime together simultaneously for a window of time represented by the following relationship.

$$(t_2 - t_3) < \frac{B^2}{D}$$

Under the conditions described hereinbefore, there is a window of time available, greater than $t_2$, for both the dopant component d and the host component h inside the compacted pellet 110 to sublime simultaneously in a uniform manner.

It is an object of the present invention to express the above relationship in terms of physical properties of each organic component in a compacted pellet and also with respect to the heat flux applied to the top surface of the compacted pellet. A mathematical model detailed below enables us to determine ideal conditions for a single evaporation source to perform effectively in order to deposit thin organic layers on a substrate having uniform and homogeneous composition.

Figure 5:
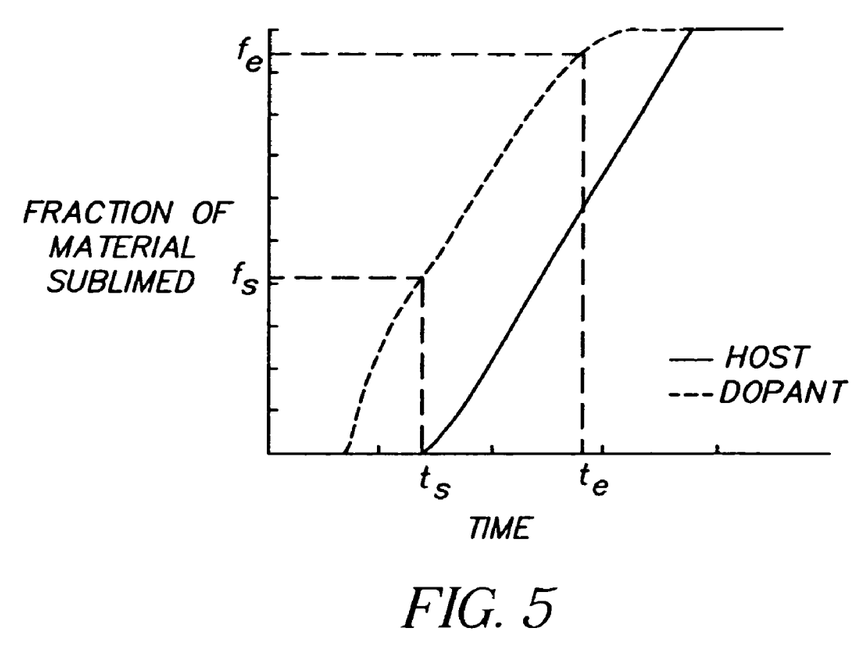
FIG. 5 shows a relationship between the time of sublimation and the fraction of pellet sublimed.

The effectiveness of a single evaporation source can be evaluated by a model developed by the present inventors to predict the effective usage of a compacted pellet comprising a mixture of two or more organic materials in a single source evaporation process. FIG. 5 illustrates, in general, the effective usage of a compacted pellet for a single evaporation source wherein deposition time t is plotted against the fraction f of sublimed materials, either host or dopant, from a compacted pellet. The fraction f may be defined as the weight fraction of a compacted pellet that is sublimed into the vapor phase as the heat flux is applied for a certain time interval. As for example, if the compacted pellet weighs 10 grams at the beginning of the sublimation process, and if either 1 gram of dopant or 1 gram of host is sublimed into vapor phase after a time interval t, then the numerical value of f is 0.1 at that instant. Referring to FIG. 5 again, the host component commences sublimation at time $t_s$ whereas the sublimation process for the dopant component starts slowing down considerably around time $t_e$. The usage of the compacted pellet may be defined as the fraction of a pellet that yields a uniform sublimation of the organic components in a pre-determined ratio. Referring to FIG. 5, the usage of the pellet is $f_e - f_s$ for a time period of $t_e - t_s$.

The problem associated with sublimation is similar to the problem associated with melting. The problem of melting has been studied extensively by many authors. (Ref: T. R. Goodman, "The Heat Balance Integral and It's Application to Problem involving a Change of Phase", ASME Trans. Vol. 80, No. 2 (1958), pp. 335-342 and A. N. Tikhonov, A. A. Samarskii, Equations of Mathematical Physics, p. 282-289, MacMillan Co, 1963). In the simple case, a pellet is exposed to a vacuum at the top (x=0) (see FIG. 2) and is insulated from the side and from the bottom (x=B). A one-dimensional description may be sufficient to model the sublimation process from a single evaporation source. The model can be described by the energy conservation of the source (compacted pellet) and the mass conservation of sublimed (vaporized) dopant species.

$$\begin{cases} [\rho C_p + L_1 \rho_1 \delta(T - T_1) + L_2 \rho_2 \delta(T - T_2)] \frac{\partial T}{\partial t} = \frac{\partial}{\partial x}\left(K \frac{\partial T}{\partial x}\right) & \text{Equation 1} \\ \quad \text{in } 0 \leq x \leq B \\ K \frac{\partial T}{\partial x} = -F(t) \text{ at } x = 0 \\ \frac{\partial T}{\partial x} = 0 \text{ at } x = B \\ T = T_0 \text{ at } t = 0 \end{cases}$$

$$\begin{cases} \frac{\partial C}{\partial t} = \frac{\partial}{\partial x}\left(D \frac{\partial C}{\partial x}\right) + \rho_1 \delta(T - T_1) \frac{\partial T}{\partial t} & \text{in } 0 \leq x \leq B \quad \text{Equation 2} \\ C = 0 \text{ at } t = 0 \\ C = 0 \text{ at } x = 0 \\ \frac{\partial C}{\partial x} = 0 \text{ at } x = B \end{cases}$$

where $\rho$ is the density of the source (g/cc)

$C_p$ is the heat capacity of the source (J/(g K))

$L_1$ is the latent heat of sublimation of dopant (J/g)

$\rho_1$ is the density of dopant (g/cc)

T is the temperature of the source (C)

$T_1$ is the sublimation temperature of dopant (C)

$L_2$ is the latent heat of sublimation of host (J/g)

$\rho_2$ is the density of host (g/cc)

$T_2$ is the sublimation temperature of host (C)

K is the thermal conductivity of source (W/(cm K))

F is the applied heat flux (W/cm$^2$)

B is the vertical height of the source (cm)

$T_0$ is the initial temperature of the source (C)

C is the concentration of vaporized dopant (g/cc)

D is the diffusion coefficient of vaporized dopant (cm$^2$/s)

Equation 1 describes the temperature profile and Equation 2 enables us to compute the amount of dopant or host escaping from the surface in a vapor state. The host starts subliming from the pellet once the temperature reaches its sublimation temperature. Therefore once the surface temperature reaches the sublimation temperature of the host (host is the majority component in a compacted pellet), surface temperature remains at the sublimation temperature of the host.

Figure 14:
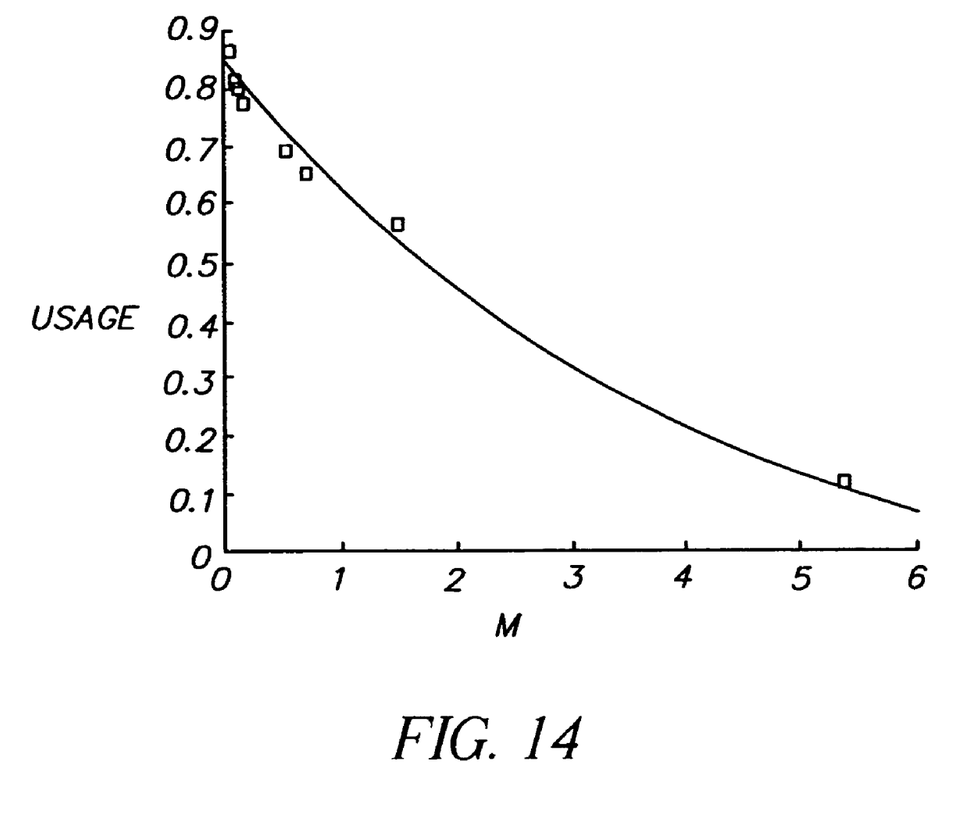
FIG. 14 shows graphically the effective usage of a compacted pellet as a single deposition source.

The usage of the compacted pellet is directly related to a measure of the effectiveness of the single evaporation source. There are no exact analytical solutions to the above equations. A simplified solution to the equations discussed hereinbefore suggests that a non-dimensional quantity M as shown by the following relationship:

$$M = \frac{((T_2 - T_0)^2 - (T_1 - T_0)^2) K \rho C_p D}{F^2 B^2}$$

is related to the usage of the compacted pellet. M can be interpreted as the ratio of the $(t_2-t_1)$ to the time for the sublimed dopant component d close to the bottom surface to escape through the top surface 112 of the compacted pellet (FIG. 4). The usage is inversely proportional to the non-dimensional quantity M, as shown in FIG. 14. The preferable value for M is any positive number less than 2.

There are many factors which influence or directly affect the usage of a compacted pellet and as a result the numerical value of M can change considerably. Example 4 in Table 1 shows physical parameters of a compacted pellet for which the numerical value of M is 0.045 and that directly corresponds to 86.2% usage of the compacted pellet. On the other hand, the example 8 in Table 1 shows physical parameters of a compacted pellet for which the numerical value of M is very high such as 5.376 corresponding to only 12.3% usage of the compacted pellet. A series of examples are presented hereinafter which clearly demonstrate the relationship between the usage of a compacted pellet and the non-dimensional quantity M suggesting that the present invention is a very powerful and useful tool to predict very accurately the usability of a compacted pellet in a single evaporation source depositing thin and uniform organic layers having homogeneous composition.

In the following examples we will be using a compacted pellet having two organic components mixed homogeneously wherein one component is a dopant and the other component is a host. The compacted pellet is nested inside a boat having a vertical length 15 cm (B=15 cm) wherein the top surface is heated and the other three surfaces are thermally insulated as shown in FIG. 2. The weight fraction of the dopant is 5% and the balance is host. The latent heat of sublimation, $L_1$ and $L_2$, for both host and dopant components respectively is 402.5 J/g. Heat capacity of the pellet, $C_p$, is 0.84 J/(g K) and the density, $\rho$, of the pellet is 1 g/cc and the initial temperature of the pellet is 25° C. Thermal conductivity, K is in the units of W/(cm K), material diffusion coefficient, D is in the units of $cm^2/s$, applied heat flux, F is in the units of $W/(cm^2)$ and is kept constant, and sublimation temperatures of the dopant and the host, $T_1$ and $T_2$ respectively, are in the unit of degree C.

TABLE 1

| Example | K | D | F | T1 | T2 | Usage | M |
|---|---|---|---|---|---|---|---|
| 1 | 0.008 | 0.001 | 0.1 | 300 | 200 | 0.800 | 0.134 |
| 2 | 0.008 | 0.001 | 0.1 | 300 | 150 | 0.772 | 0.180 |
| 3 | 0.008 | 0.001 | 0.05 | 300 | 150 | 0.651 | 0.719 |

TABLE 1-continued

| Example | K | D | F | T1 | T2 | Usage | M |
|---|---|---|---|---|---|---|---|
| 4 | 0.008 | 0.001 | 0.2 | 300 | 150 | 0.862 | 0.045 |
| 5 | 0.006 | 0.001 | 0.1 | 300 | 200 | 0.812 | 0.100 |
| 6 | 0.008 | 0.001 | 0.05 | 300 | 200 | 0.691 | 0.538 |
| 7 | 0.008 | 0.001 | 0.03 | 300 | 200 | 0.564 | 1.493 |
| 8 | 0.008 | 0.01 | 0.05 | 300 | 200 | 0.123 | 5.376 |

Figure 6:
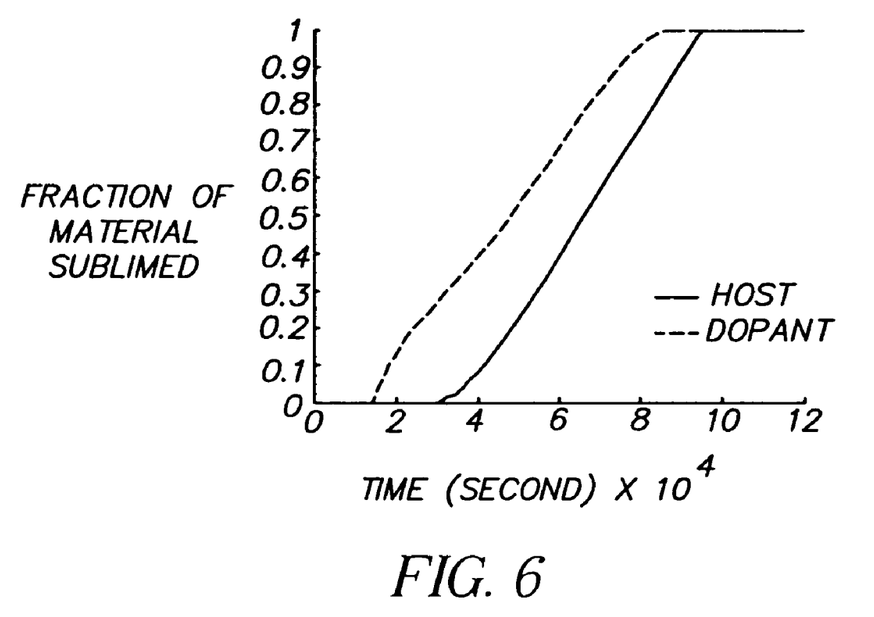
FIG. 6 shows an ideal sublimation condition for a host and a dopant subliming from a compacted pellet.

Example 1 is shown graphically in FIG. 6. The physical parameters used in this example are typical for OLED materials and those parameters may be treated as a baseline for Examples 2 through 8. The heat flux, 0.1 W/cm2, results in the usage of 80%. Examples 2 through 8 show how the numerical value of M and as a result the usage of the compacted pellet changes drastically from those in Example 1 if only a few parameters are varied slightly. The examples in Table 1 therefore suggest that one can predict very precisely the performance of a single evaporation source well ahead of the deposition process.

Figure 7:
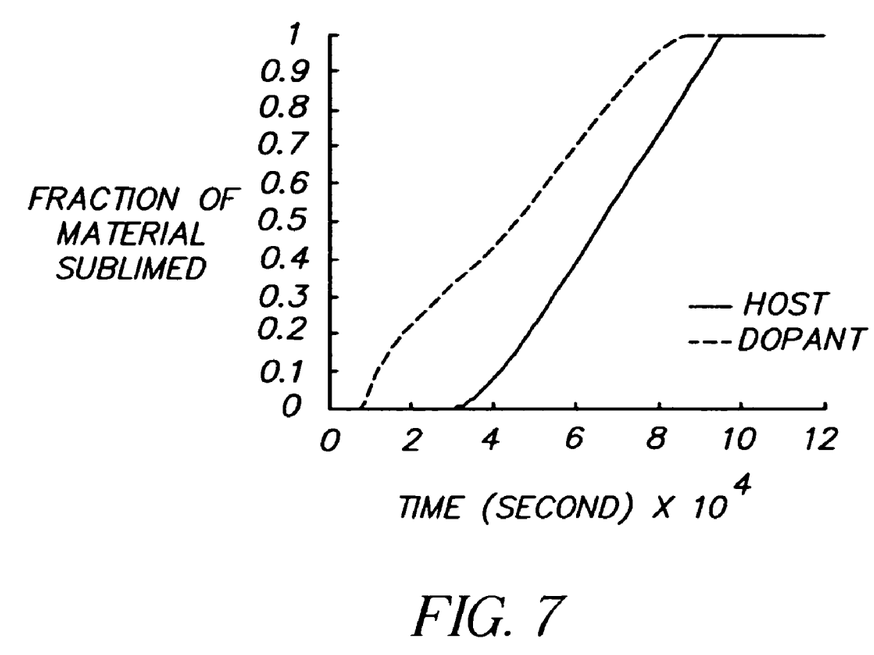
FIG. 7 shows a sublimation condition when the sublimation temperature of dopant is relatively lower than that of the host.

Example 2 is presented graphically in FIG. 7. In this case, the sublimation temperature of the dopant component is 150° C. instead of 200° C. and all other parameters are exactly the same as in Example 1. The usage is decreased to 77%. An increase in the difference in sublimation temperatures between the host and dopant components will tend to decrease the usage of a compacted pellet.

Figure 8:
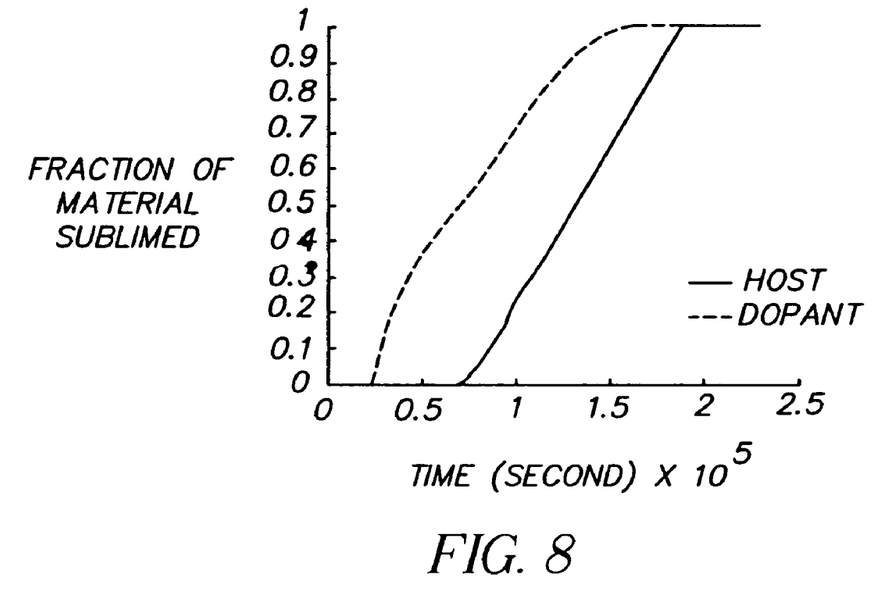
FIG. 8 shows another sublimation condition when a very low heat flux is applied.

Example 3 is presented graphically in FIG. 8. In this case, the only parameter changed is the heat flux applied to the compacted pellet which is 0.05 $W/cm^2$ as compared to 0.1 $W/cm^2$ as in Example 2. The usage is decreased to 65%. A decrease in applied heat flux will decrease the usage.

Figure 9:
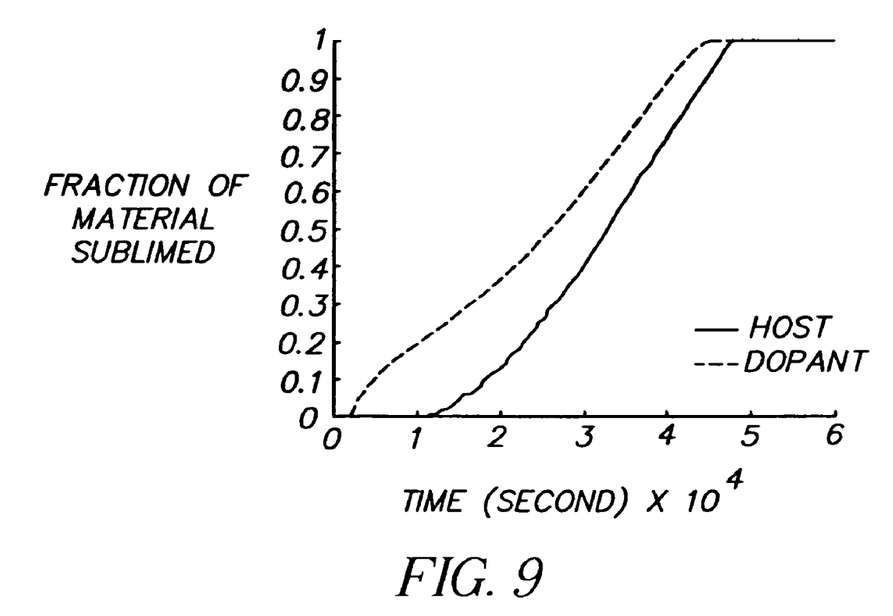
FIG. 9 shows a sublimation condition when a relatively greater heat flux is applied.

Example 4 is shown graphically in FIG. 9. In this case, the heat flux applied to the pellet is 0.2 $W/cm^2$ and all other parameters are the same as in Example 2. The usage is increased to 86%. An increase in applied heat flux from the top surface while other physical parameters remain the same for a compacted pellet renders the single evaporation source more efficient.

Figure 10:
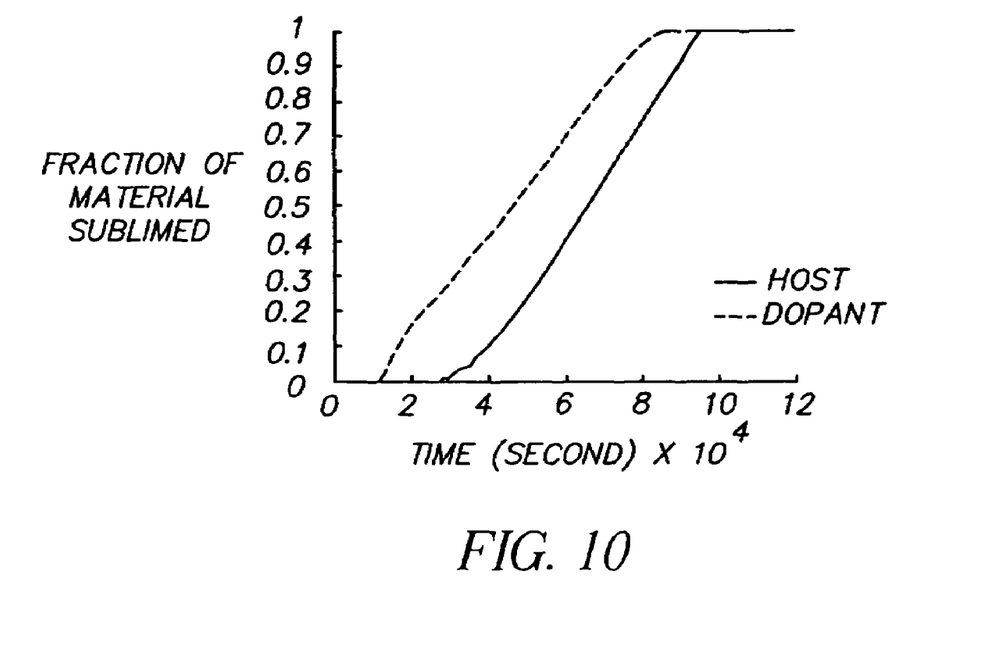
FIG. 10 shows a sublimation plot wherein thermal conductivity of the compacted pellet is low.

Example 5 is presented graphically in FIG. 10. In this example, the thermal conductivity of the source is 0.006 W/(cm K) and all other parameters are the same as in Example 1. The usage is increased to 81%. An infinitesimal decrease in thermal conductivity from 0.008 W/(cm K) to 0.006 W/(cm K) improves the usage by 1%.

Figure 11:
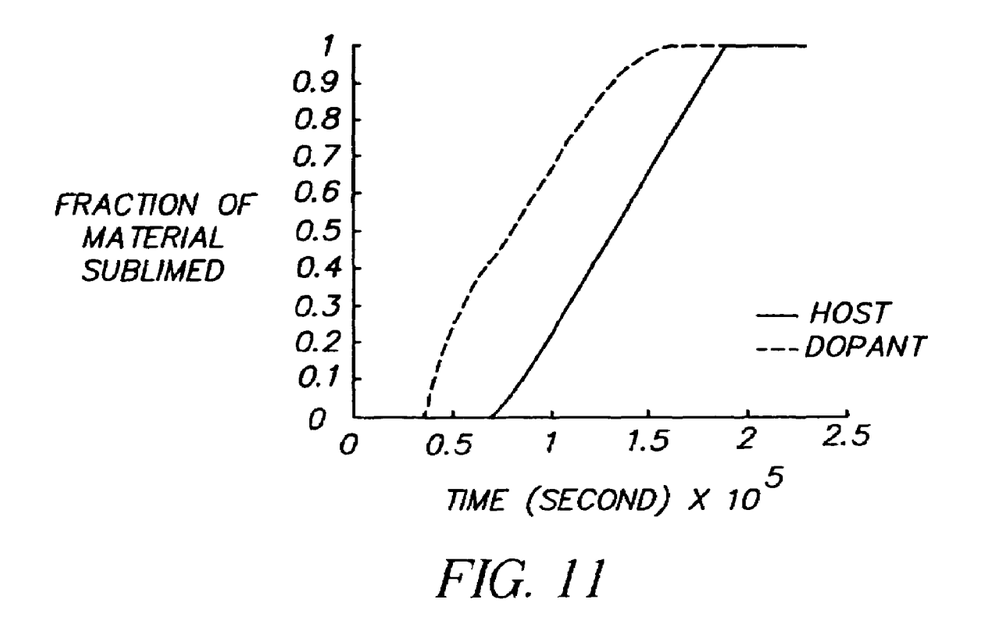
FIG. 11 shows a sublimation plot wherein the heat flux is reduced.

Example 6 is shown graphically in FIG. 11. In this example, the heat flux applied to the pellet is 0.05 $W/cm^2$ and all other parameters are the same as in Example 1. The usage is decreased to 69%. A decrease in applied heat flux will decrease the usage considerably.

Figure 12:
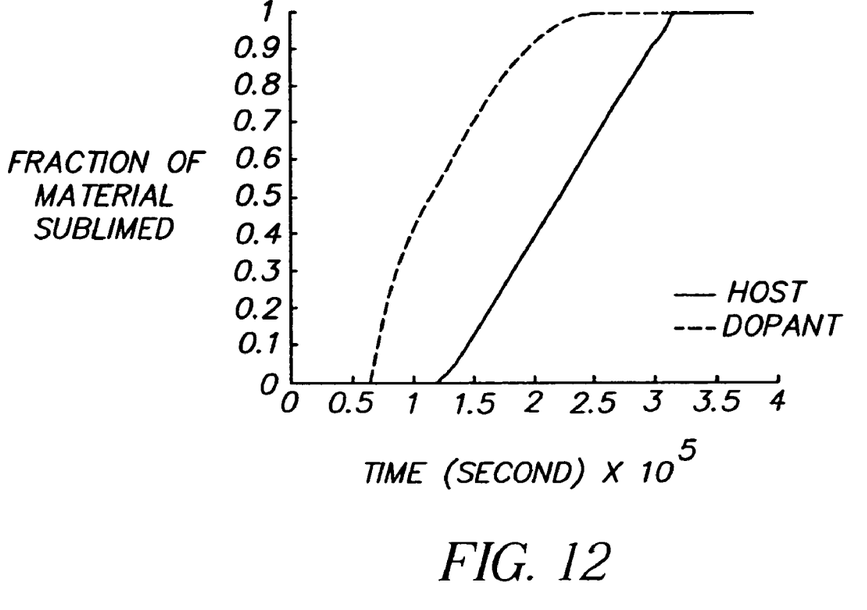
FIG. 12 shows another sublimation plot as in FIG. 11 wherein the heat flux is further reduced.

Example 7 is shown graphically in FIG. 12. In this example, the heat flux applied to the pellet is 0.03 $W/cm^2$ and all other parameters are the same as in Example 1. The usage is decreased to 56%. A decrease in applied heat flux substantially decreases the usage of the compacted pellet.

Figure 13:
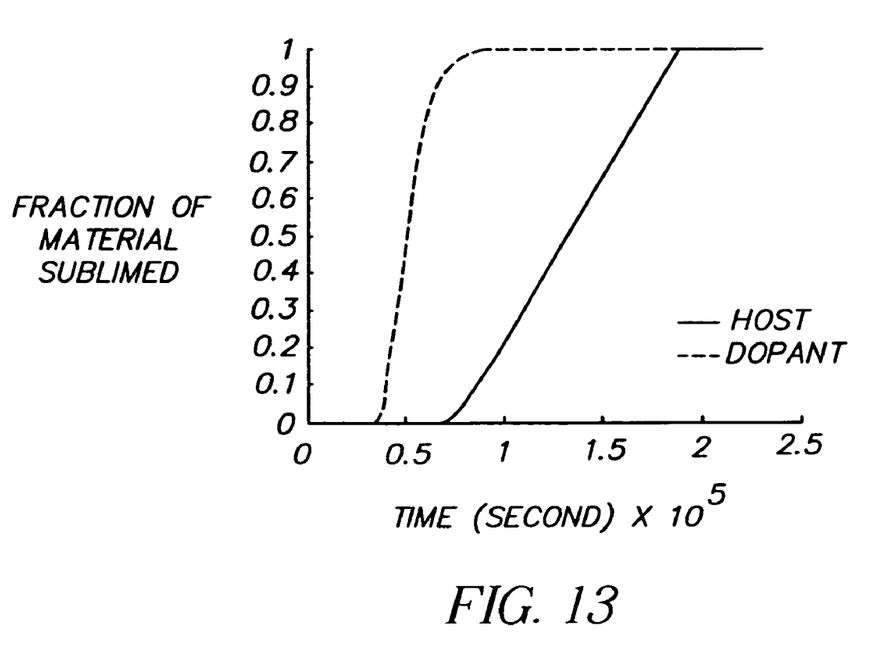
FIG. 13 shows a sublimation plot of organic materials wherein sublimed dopant has a high diffusion coefficient.

Example 8 is presented graphically in FIG. 13. In this example, the diffusion coefficient for sublimed dopant is 0.01 $cm^2/s$ as compared to 0.001 $cm^2/s$ as in Example 1, and all other parameters are the same. The usage is decreased to 12%. High diffusion coefficient of the vaporized molecules may result from a single evaporation source equipped with un-compacted powder. An increase in diffusion coefficient will substantially decrease the usage.

The relationship between the usage of a compacted pellet and the non-dimensional quantity M is plotted graphically as shown in FIG. 14. The plot shows that the M value increases non-linearly with respect to the usage. The plot also suggests that to achieve effective usage greater than 50% of a compacted pellet in a single evaporation source, the M value must be numerically lower than 2.

The examples of single source evaporation using a compacted pellet described hereinbefore show that single source evaporation of organic materials comprising at least one host component and at least one dopant component is a viable and cost-effective practical method of depositing a thin organic layer on a substrate.

The heat flux can be conveniently controlled by applying heat from the top of the compacted pellet and also by controlling the rate of heat application. The diffusivity D of the organic components can also be controlled substantially by using a compacted pellet rather than material in powder form. If the concentration of the organic components with the lowest sublimation temperature exceeds the percolation limit, the material diffusion coefficient will increase sharply. It is advised to keep the concentration of the organic components with the lowest sublimation temperature below the percolation limit. Another very important parameter the thermal conductivity K can be lowered by mixing organic material with non-sublimable inorganic material such as alumina and zirconia having lower thermal conductivity. The formula for the quantity M suggests that single source evaporation using a compacted pellet is possible and can be made efficient by lowering K and D and increasing applied heat flux.

The invention has been described in detail with particular reference to certain preferred embodiments thereof, but it will be understood that variations and modifications can be effected within the spirit and scope of the invention.

PARTS LIST

| | |
|---|---|
| 10 | physical vapor deposition chamber |
| 20 | compacted pellet (source) |
| 30 | receptacle |
| 50 | single evaporation source |
| 51 | bell jar |
| 60 | heater |
| 62 | baffle |
| 64 | openings |
| 70 | DC power supply |
| 72 | substrate |
| 74 | shutter |
| 80 | thickness controller |
| 82 | crystal |
| 100 | single evaporation source |
| 110 | compacted pellet |
| 112 | top surface |
| 114 | bottom surface |
| 120 | vertical dimension B |
| 130 | quartz boat |
| 140 | heating element |
| 144 | heat flux |

The invention claimed is:

1. A method of using a compacted pellet having uniform blended mixture with at least first and second different organic components that sublime at temperatures $T_1$ and $T_2$ respectively, wherein $T_1$ represents the temperature of the first organic material with the lowest sublimation temperature and $T_2$ represents the temperature of the second organic material with the highest sublimation temperature, to form an organic layer having a uniform blended mixture of the organic components, comprising:

(a) providing a compacted pellet, having a top and bottom surface, into a boat having an open top surface wherein the compacted pellet conforms to the interior of the boat; and (b) applying heat to the top of the compacted pellet to cause the deposition of a uniform blended mixture of the organic components to form an organic layer, wherein the top surface of the compacted pellet reaches $T_2$ before the bottom surface reaches $T_1$.

2. The method of claim 1 wherein during deposition, the value of M in the following relationship is less than 2:

$$M = \frac{((T_2 - T_0)^2 - (T_1 - T_0)^2) K \rho C_p D}{F^2 B^2}$$

wherein $\rho$ is the density of the compacted pellet (g/cc)

$C_p$ is the heat capacity of the compacted pellet (J/(g K))

$T_0$ is the initial temperature of the compacted pellet (C)

$T_1$ is the sublimation temperature of first organic material (C)

$T_2$ is the sublimation temperature of second organic material (C)

K is the thermal conductivity of the compacted pellet (W/(cm K))

D is the diffusion coefficient of vaporized first organic material (cm$^2$/s)

F is the applied heat flux (W/cm$^2$)

B is the vertical height of the compacted pellet (cm).

3. The method of claim 1 wherein the organic layer is part of an OLED structure.

4. A method of using a compacted pellet having uniform blended mixture with at least first and second different organic components that sublime at temperatures $T_1$ and $T_2$ respectively, wherein $T_1$ represents the temperature of the first organic material with the lowest sublimation temperature and $T_2$ represents the temperature of the second organic material with the highest sublimation temperature, to form an organic layer having a uniform blended mixture of the organic components, comprising:

(a) providing a compacted pellet, having a top and bottom surface, into a boat having an open top surface wherein the compacted pellet conforms to the interior of the boat; and (b) applying heat to the top of the compacted pellet to cause the deposition of a uniform blended mixture of the organic components to form an organic layer, wherein the bottom surface reaches $T_1$ before the top surface reaches $T_2$.

5. The method of claim 4 wherein when the bottom surface of the compacted pellet reaches $T_1$ before the top surface reaches $T_2$, and the following relationship defines the window of time in which all the components in the boat sublime together: $(t_2-t_3)<B^2/D$, wherein $t_2$ is the time that the surface temperature reaches temperature $T_2$, $t_3$ is the time that the bottom surface reaches temperature $T_1$, B is the vertical height of the compacted pellet, and D is the material diffusivity of the vaporized organic material with the lowest sublimation temperature.

* * * * *